United States Patent
Hou et al.

(10) Patent No.: US 11,626,272 B2
(45) Date of Patent: Apr. 11, 2023

(54) SPUTTERING EQUIPMENT AND OPERATION METHOD THEREOF

(71) Applicant: Au Optronics Corporation, Hsinchu (TW)

(72) Inventors: Chun-Yueh Hou, Hsinchu (TW); Hao-An Chuang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/369,968

(22) Filed: Jul. 8, 2021

(65) Prior Publication Data

US 2022/0051883 A1 Feb. 17, 2022

Related U.S. Application Data

(60) Provisional application No. 63/065,641, filed on Aug. 14, 2020.

(30) Foreign Application Priority Data

Feb. 19, 2021 (TW) ................... 110105874

(51) Int. Cl.
*C23C 14/50* (2006.01)
*H01J 37/34* (2006.01)
*C23C 14/34* (2006.01)

(52) U.S. Cl.
CPC ...... *H01J 37/3435* (2013.01); *C23C 14/3407* (2013.01); *C23C 14/50* (2013.01); *C23C 14/505* (2013.01)

(58) Field of Classification Search
None
See application file for complete search history.

(56) References Cited

U.S. PATENT DOCUMENTS

| | | | |
|---|---|---|---|
| 2007/0137574 A1* | 6/2007 | Sichanugrist | ..... H01J 37/32541 118/728 |
| 2011/0089031 A1 | 4/2011 | Cheng et al. | |
| 2016/0326651 A1* | 11/2016 | Sato | ................. H01J 37/32091 |

FOREIGN PATENT DOCUMENTS

| | | |
|---|---|---|
| CN | 104109835 | 10/2014 |
| CN | 109763168 | 5/2019 |
| CN | 111471982 | 7/2020 |
| TW | I230678 | 4/2005 |
| TW | M295122 | 8/2006 |
| TW | 201114929 | 5/2011 |
| TW | I347917 | 9/2011 |
| TW | M588697 | 1/2020 |

\* cited by examiner

*Primary Examiner* — Jason Berman
(74) *Attorney, Agent, or Firm* — JCIPRNET

(57) ABSTRACT

A sputtering equipment is adapted for sputtering substrates, where each of the substrates includes two opposite main surfaces and side surfaces connecting the two main surfaces. The sputtering equipment includes a cavity, at least one target set and a carrier box. The at least one target set is disposed in the cavity, the target set includes targets, and the targets are staggered at both side surfaces of an axis. The carrier box is movably disposed so as to enter and exit the cavity, and includes substrate accommodating grooves. The substrates are adapted for being placed in the substrate accommodating grooves of the carrier box, and at least one side surface of each of the substrates is located outside the carrier box and protrudes toward the at least one target set.

22 Claims, 16 Drawing Sheets

SPUTTERING EQUIPMENT AND OPERATION METHOD THEREOF

CROSS-REFERENCE TO RELATED APPLICATION

This application claims the priority benefit of U.S. Provisional Application No. 63/065,641, filed on Aug. 14, 2020 and Taiwan application serial no. 110105874, filed on Feb. 19, 2021. The entirety of each of the above-mentioned patent applications is hereby incorporated by reference herein and made a part of this specification.

BACKGROUND OF THE DISCLOSURE

1. Technical Field

The disclosure relates to a sputtering equipment and an operation method thereof, and particularly relates to a sputtering equipment and an operation method adapted for sputtering multiple substrates.

Description of Related Art

FIG. 1A is a schematic diagram of a substrate sputtered using a conventional method. Please refer to FIG. 1. Generally speaking, a liquid crystal panel (substrate 10) has two main surfaces 12 and multiple side surfaces 14 connected to the two main surfaces 12. The two main surfaces 12 are provided with multiple pads 16 near the side surfaces 14 (i.e. areas outside an in-plane area) (for example, there are two pads 16, one upper and one lower, near the right side in FIG. 1A). Currently, the upper and lower pads 16 are electrically connected to each other mainly by sputtering the substrate 10.

In the existing sputtering process, one single substrate 10 is placed into a sputtering cavity (not shown), and the target (not shown) is located above one main surface 12, sputtering the main surface 12 and the parts of the side surfaces 14 close to the main surface 12 so as to form an upper half of the coating layer 20. Then, the substrate 10 is turned over, and the other main surface 12 and the parts of the side surfaces 14 close to this main surface 12 are sputtered so as to form a lower half of the coating layer 20. As shown in FIG. 1A, the coating layer 20 covers the entire substrate 10. Then the parts that do not actually need to be coated are etched away so as to form a circuit connected between the upper and lower pads 16.

However, this is a time-consuming way of sputtering only a single substrate 10 at a time. Moreover, since the required circuit position is only between the upper and lower pads 16, the in-plane area of the liquid crystal panel does not need to be coated, resulting in material waste. Furthermore, sputtering with the target facing the main surface 12 will make the coating layer beside the pads 16 and near the side surfaces 14 (the area in the dashed frame in FIG. 1A) prone to defects. FIG. 1B is an image of a partial area of the substrate 10 of FIG. 1A observed under a microscope. Referring to FIG. 1B, the coating layer 20 has an obvious defect 25 beside the pads 16 and near the side surfaces 14.

SUMMARY OF THE DISCLOSURE

The disclosure provides a sputtering equipment and an operation method thereof capable of sputtering multiple substrates at the same time, which can reduce material waste and reduce the probability of defects in coating layers.

A sputtering equipment of the disclosure is adapted for sputtering multiple substrates, wherein each of the substrates includes two opposite main surfaces and multiple side surfaces connecting the two main surfaces, the sputtering equipment including: a cavity; at least one target set; and a carrier box. The at least one target set is disposed in the cavity, wherein each of the target sets includes multiple targets, and the multiple targets of each of the multiple target sets are staggered at both sides of an axis. The carrier box is movably disposed so as to enter and exit the cavity and includes multiple substrate accommodating grooves, wherein the substrates are adapted for being disposed in the substrate accommodating grooves of the carrier box, each of the substrates is adapted for protruding from the carrier box, such that at least one of the side surfaces is located outside the carrier box, and the at least one side surface protruding from the carrier box faces the at least one target set.

In an embodiment of the disclosure, the carrier box includes two opposite first sidewalls and two opposite second sidewalls; the two second sidewalls are connected to the two first sidewalls; the substrate accommodating grooves are multiple slots on at least one of the two second sidewalls; the multiple slots face the at least one target set; and the multiple substrates pass through the multiple slots.

In an embodiment of the disclosure, the substrate accommodating grooves are formed on one of the second sidewalls; the substrate accommodating grooves are multiple slots; the at least one target set is a target set; and the multiple slots face the target set.

In an embodiment of the disclosure, the carrier box further includes two positioning seats, which are movably disposed between the two first sidewalls along an extension direction of the substrate accommodating grooves so as to adjust a distance between the two positioning seats.

In an embodiment of the disclosure, the two positioning seats include multiple protrusions facing the two first sidewalls; the two first sidewalls include multiple grooves extending along the extension direction; and the protrusions are respectively movably disposed in the multiple grooves.

In an embodiment of the disclosure, the sputtering equipment further includes a support column, wherein the two first sidewalls of the carrier box include two first perforations corresponding to each other, and the support column is detachably inserted through the two first perforations.

In an embodiment of the disclosure, the two first sidewalls of the carrier box further include two second perforations corresponding to each other; a distance between the two first perforations and the second sidewall having the at least one substrate accommodating groove is different from a distance between the two second perforations and the second sidewall having the at least one substrate accommodating groove; and the support column can optionally pass through the two first perforations or the two second perforations.

In an embodiment of the disclosure, a moving direction of the carrier box is parallel to an extension direction of the substrate accommodating grooves.

In an embodiment of the disclosure, the sputtering equipment further includes multiple rotating seats, which are rotatably disposed in the cavity, and the multiple targets are disposed on the multiple rotating seats, and rotation angles of the rotating seats are between 0-40 degrees.

In an embodiment of the disclosure, the multiple rotating seats are inclined toward the axis, and rotation angles of the multiple rotating seats are between 10-35 degrees.

An operation method of sputtering equipment of the disclosure includes placing multiple substrates into multiple substrate accommodating grooves of a carrier box of a sputtering equipment, wherein each of the substrates includes two opposite main surfaces and multiple side surfaces connecting the two main surfaces, and each of the substrates protrudes from the carrier box, such that at least one of the side surfaces is located outside the carrier box; placing the carrier box together with the carried substrates carried into a cavity of the sputtering equipment, wherein the sputtering equipment includes at least one target set disposed in the cavity, each target set includes multiple targets, the multiple targets in each target set are staggered on both sides of an axis, and the at least one side surface of each of the substrates is exposed from the carrier box faces the at least one target set; and the at least one target set sputtering the at least one side surface of each substrate.

In an embodiment of the disclosure, two main surfaces of each of the substrates respectively includes two pads; the two pads are close to one of the side surfaces; the side surfaces and the two pads are exposed in the carrier box; and the side surfaces face the target set, wherein after a step of sputtering the side surface of each substrate by the target set, a coating layer is formed at a part on the side surface and the two main surfaces near the side surface, and the coating layer covers the two pads.

In an embodiment of the disclosure, the multiple targets include at least one first target and at least one second target, and a step of sputtering the at least one side surface of each substrate further includes: moving the carrier box to a position corresponding to the at least one first target so as to sputter the at least one first target onto the at least one side surface of each of the substrates so as to form at least one first coating layer on the at least one side surface; and moving the carrier box to a position corresponding to the at least one second target so as to sputter the at least one second target onto the at least one first coating layer so as to form at least one second coating layer.

In an embodiment of the disclosure, after sputtering the at least one second target to the at least one side surface of each of the substrates, the method further including: moving the carrier box to a position corresponding to the at least one first target again, so as to sputter the at least one first target onto the at least one second coating layer so as to form at least one third coating layer.

In an embodiment of the disclosure, the carrier box includes two opposite first sidewalls and two opposite second sidewalls; the two second sidewalls are connected to the two first sidewalls; the substrate accommodating grooves are multiple slots on at least one of the two second sidewalls; the multiple slots face the at least one target set; and the multiple substrates pass through the multiple slots.

In an embodiment of the disclosure, the substrate accommodating grooves are formed on one of the second sidewalls; the substrate accommodating grooves are multiple slots; the multiple substrates pass through the multiple substrate accommodating grooves of the second sidewall; and the at least one target set is a target set; and the multiple side surfaces of the multiple substrate accommodating grooves passing through the second sidewall face the target set.

In an embodiment of the disclosure, the sputtering equipment further includes a support column; the two first sidewalls of the carrier box include two first perforations corresponding to each other and two second perforations corresponding to each other; a distance between the two first perforations and the second sidewall having the at least one substrate accommodating groove is different from a distance between the two second perforations and the second sidewall having the at least one substrate accommodating groove; and before a step of placing the substrates into the carrier box of the sputtering equipment, the method further includes: detachably inserting the support column on the two first perforations or the two second perforations according to a width of the at least one substrate.

In an embodiment of the disclosure, the carrier box further includes two positioning seats, which are movably disposed between the two first sidewalls along an extension direction of the substrate accommodating grooves so as to adjust a distance between the two positioning seats; and before the step of placing the substrates into the carrier box of the sputtering equipment, the method further including: adjusting a distance between the two positioning seats to a length corresponding to the substrates.

In an embodiment of the disclosure, the two positioning seats include multiple protrusions facing the two first sidewalls, the two first sidewalls include multiple grooves extending along the extension direction, and the protrusions are respectively movably disposed in the multiple grooves.

In an embodiment of the disclosure, a moving direction of the carrier box is parallel to an extension direction of the substrate accommodating grooves.

In an embodiment of the disclosure, before a step of sputtering the at least one side surface of each of the substrates, the method further including: adjusting angles of the targets, where the sputtering equipment further includes multiple rotating seats, which are rotatably disposed in the cavity; the targets are disposed on the rotating seats; and rotation angles of the rotating seats are between 0-40 degrees.

In an embodiment of the disclosure, the multiple rotating seats are inclined toward the axis, and rotation angles of the multiple rotating seats are between 10-35 degrees.

In summary, in the conventional sputtering equipment, the target sputters a large area of the main surface of the substrate, and can only sputter one piece at a time. To sputter multiple substrates, the process needs to be repeated multiple times, which is quite time-consuming. Later, the coating layer on the main surface needs to be removed, which causes waste. Furthermore, defects are likely to occur in the coating layer beside the pads and near the side surfaces using the conventional sputtering design with the target facing the main surface. The sputtering equipment and operation method of the disclosure is to sputter the side surfaces between the two pads in the substrate. The carrier box in the sputtering equipment of the disclosure may allow multiple side surfaces of multiple substrates to protrude from the carrier box and face the target set. Therefore, the target set may sputter the side surfaces of the substrates at the same time, which can save man-hours and materials. Moreover, the design of target sputtering facing side surfaces may effectively reduce the probability of defects in coating layers. Furthermore, in the sputtering equipment and operation method of the disclosure, the targets of the target set are alternately disposed on both sides of the axis, and the side surface of the substrate may be sputtered slightly staggered to improve the uniformity of the coating.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
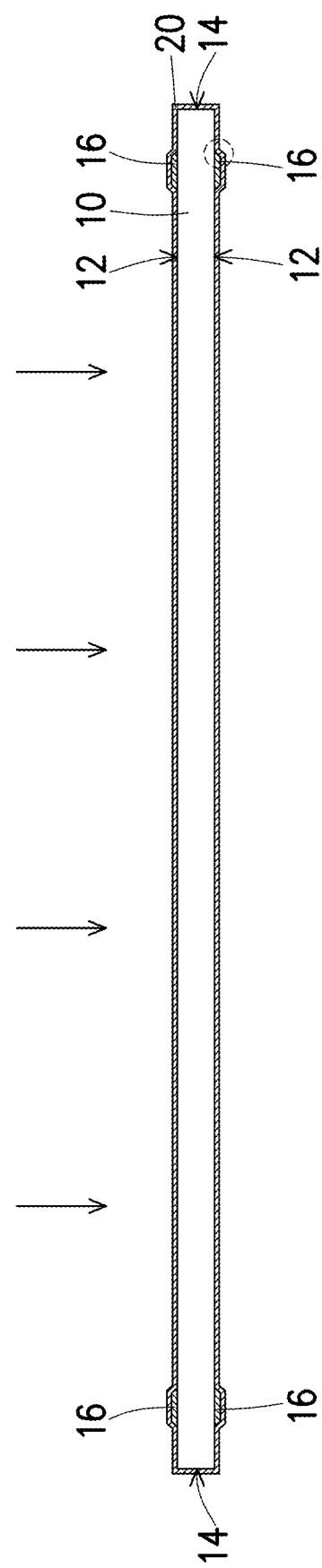
FIG. 1A is a schematic diagram of a substrate sputtered using a conventional method.
Figure 1B:
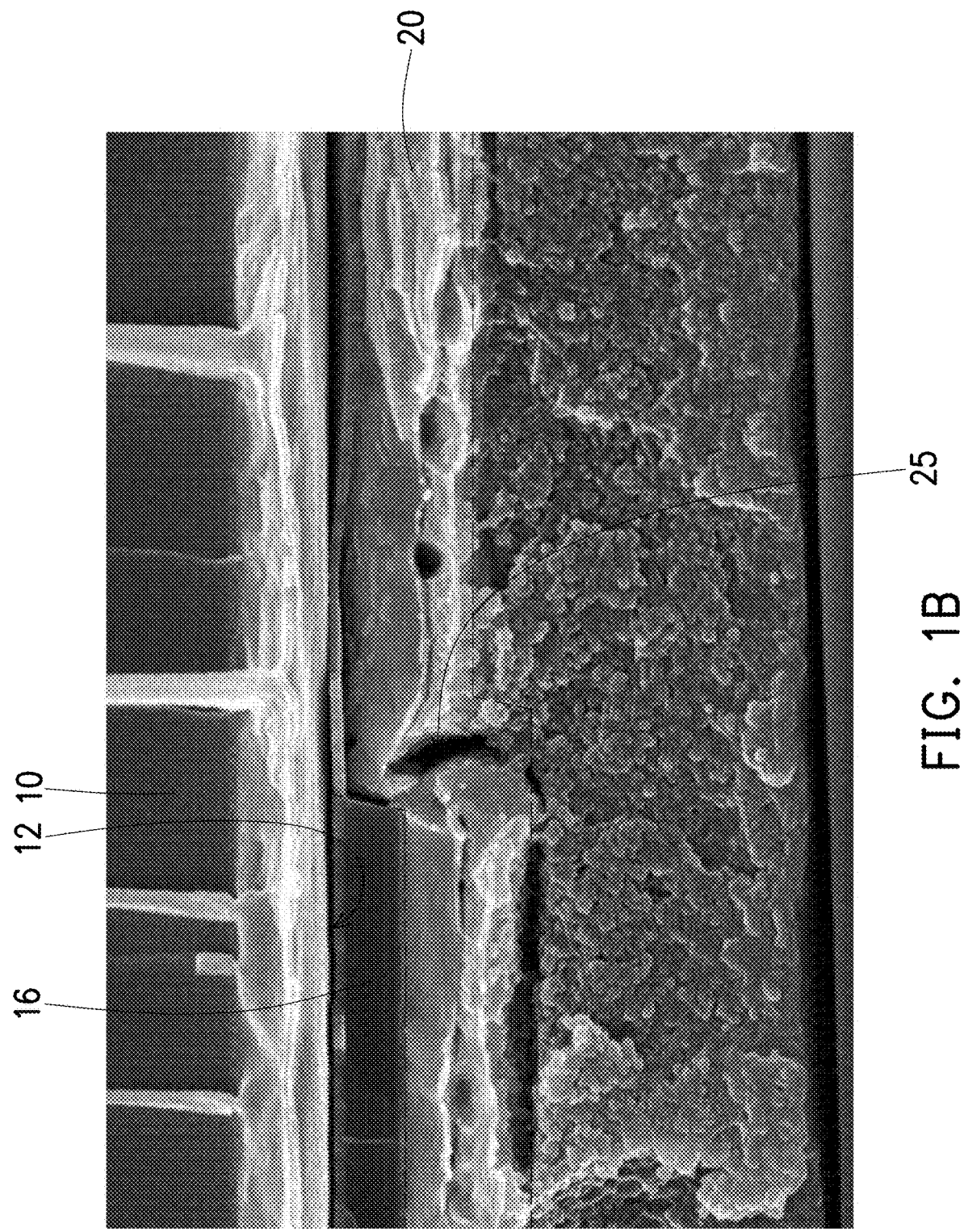
FIG. 1B is an image of a partial area of the substrate of FIG. 1A observed under a microscope.

In the drawings, the thickness of layers, films, panels, regions, and the like are enlarged for clarity. Throughout the specification, the same reference numerals denote the same elements. It should be understood that when an element such as a layer, film, region, or substrate is referred to as being on or connected to another element, it may be directly on or connected to the other element, or the intermediate element may also be present. In contrast, when an element is referred to as being directly on or directly connected to another element, there is no intermediate element. As used herein, connection may refer to physical and or electrical connection. Furthermore, the electrical connection or coupling may be that there are other elements between the two elements.

Figure 2:
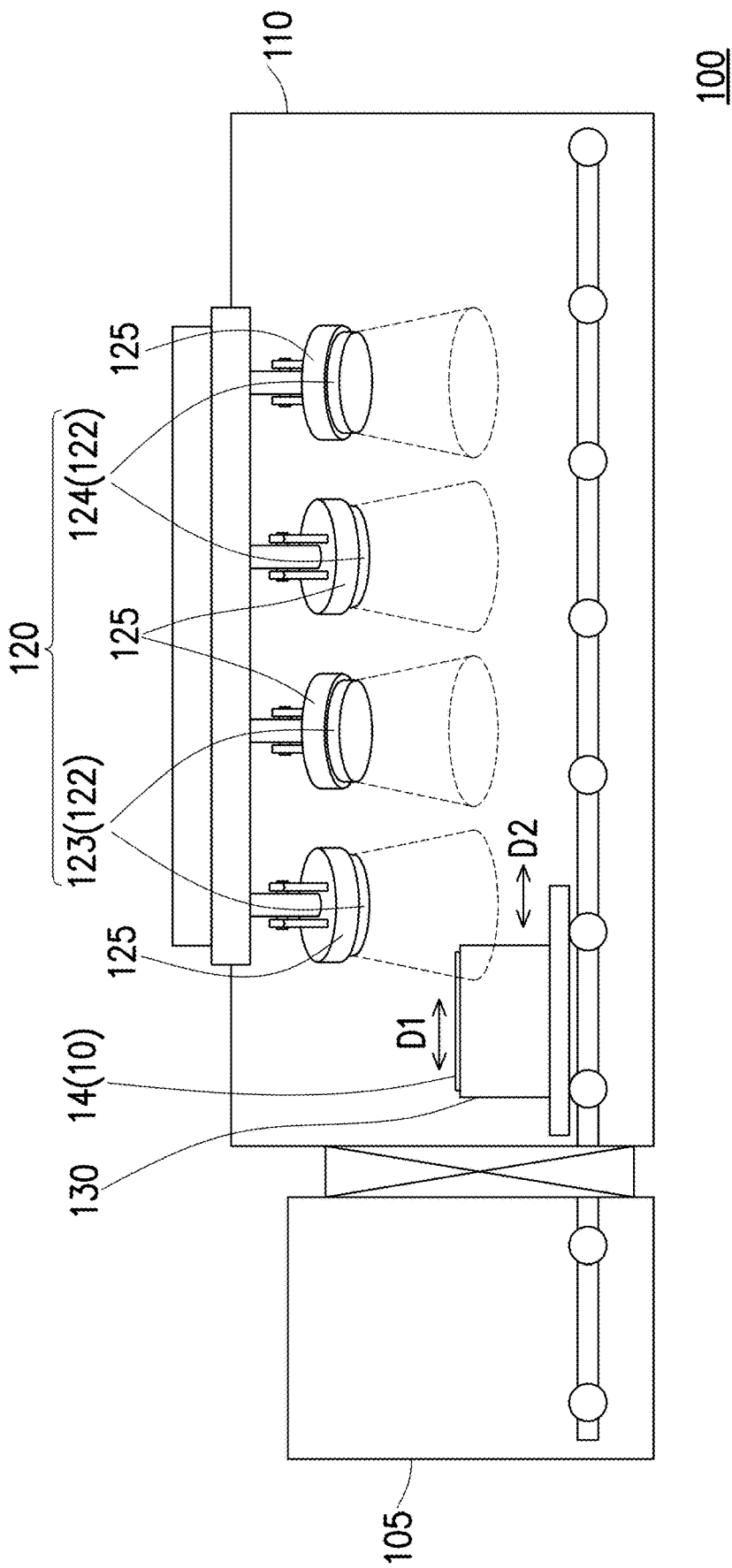
FIG. 2 is a schematic diagram of a sputtering equipment according to an embodiment of the disclosure.
Figure 3:
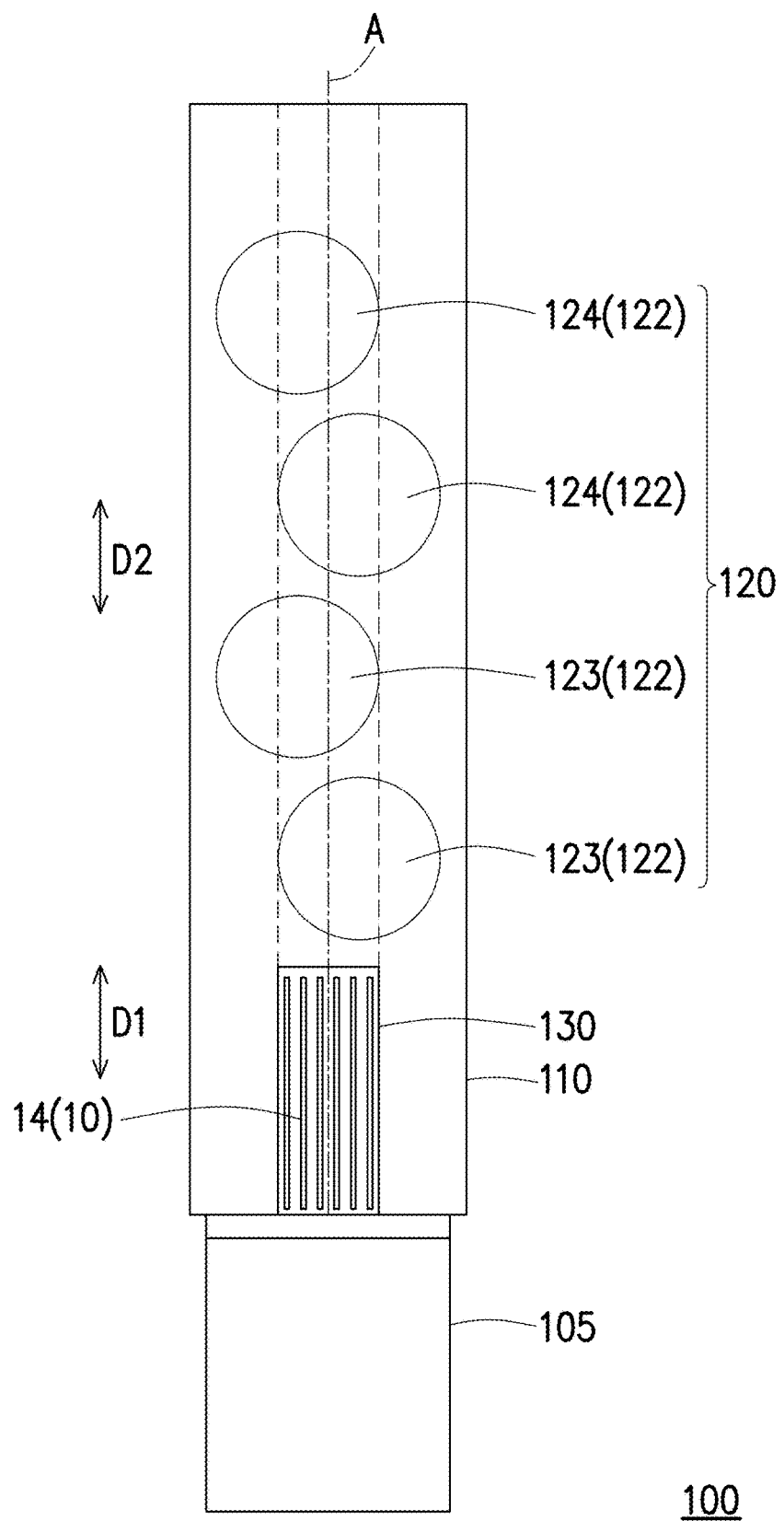
FIG. 3 is a schematic top view of the sputtering equipment of FIG. 2.

FIG. 2 is a schematic diagram of a sputtering equipment according to an embodiment of the disclosure. FIG. 3 is a schematic top view of the sputtering equipment of FIG. 2. Referring to FIGS. 2 and 3, a sputtering equipment 100 of the present embodiment is adapted for sputtering multiple substrates 10 at the same time. The sputtering equipment 100 includes a preload cavity 105, a cavity 110 connected to the preload cavity 105, a target set 120 disposed in the cavity 110, and a carrier box 130 movably disposed so as to enter and exit the preload cavity 105 and the cavity 110.

The target set 120 is disposed in the cavity 110, and the target set 120 includes multiple targets 122. Specifically, the target set 120 includes multiple first targets 123 and multiple second targets 124. The first target 123 may be, for example, molybdenum, and the second target 124 may be, for example, copper, but the type of target 122 is not limited thereto.

As shown in FIG. 3, the first targets 123 and the second targets 124 are staggered on both sides of an axis A, and may be slightly staggered to sputter the side surfaces 14 of the substrate 10, so as to improve the uniformity of the coating. For example, in FIG. 3, the lowest target 122 (the first target 123) is located to the right of axis A; the target 122 (first target 123) second from the bottom is located to the left of the axis A; the target 122 (the second target 124) third from the bottom is located to the right of axis A; and the uppermost target 122 (the second target 124) is located to the left of the axis A. Of course, the number and location of the target 122 are not limited thereto.

The carrier box 130 is adapted for carrying the substrates 10, and one of the side surfaces 14 of each substrate 10 is located outside the carrier box 130. Please return to FIG. 2. The carrier box 130 may enter the cavity 110 from the preload cavity 105 along a moving direction D2 and pass under the first target 123 and the second target 124, such that the first targets 123 and the second targets 124 sputter the side surfaces 14 of the substrates 10.

Figure 4:
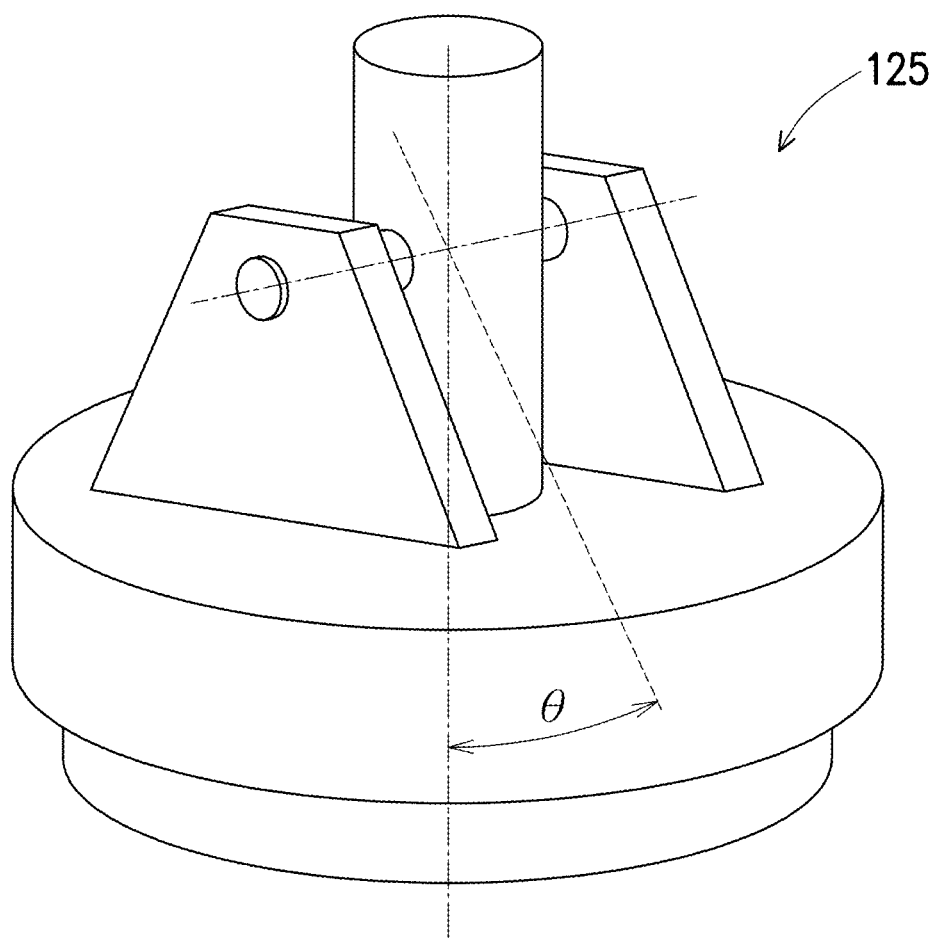
FIG. 4 is a schematic diagram of a rotating seat of the sputtering equipment of FIG. 2.

FIG. 4 is a schematic diagram of a rotating seat of the sputtering equipment of FIG. 2. Referring to FIGS. 2 and 4, in the present embodiment, the sputtering equipment 100 (FIG. 2) further includes multiple rotating seats 125, which are rotatably disposed in the cavity 110 (FIG. 2), and the targets (FIG. 2) are disposed on the rotating seats 125. A rotation angle θ of the rotating seat 125 (FIG. 4) may be adjusted so as to adjust an angle of the target. The rotation angle θ of the rotating seat 125 is between 0-40 degrees. In a preferred embodiment, the rotation angle θ of the rotating seat 125 is between 10-35 degrees.

In the present embodiment, the rotating seats 125 are inclined toward the axis A (marked in FIG. 3), and may face toward the side surfaces 14 of the substrate 10 from the upper left or upper right of side surfaces 14 of substrate 10 as shown in FIG. 2, so as to improve the uniformity of the coating layer.

Figure 5:
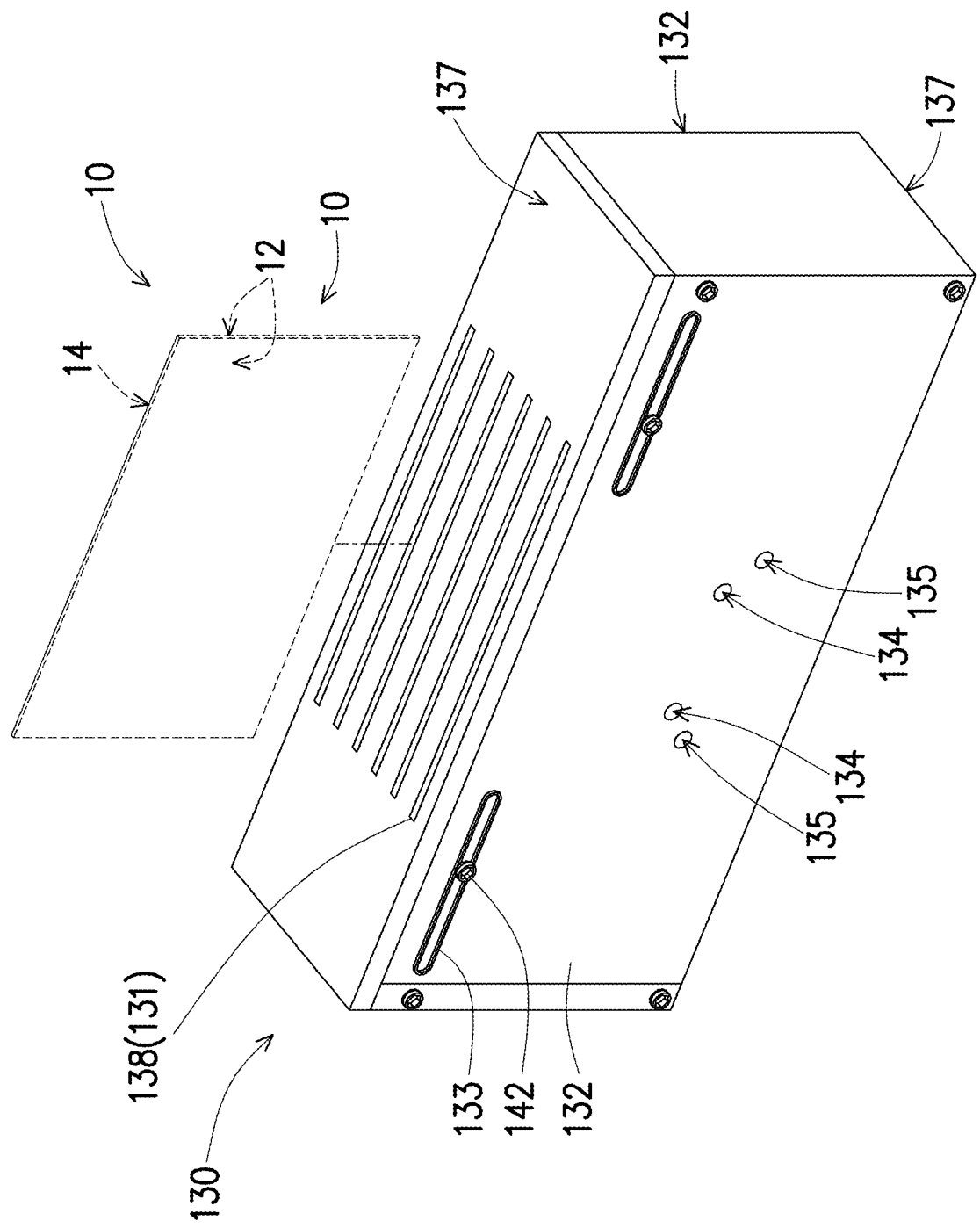
FIG. 5 is a schematic diagram of a carrier box of the sputtering equipment of FIG. 2.
Figure 6:
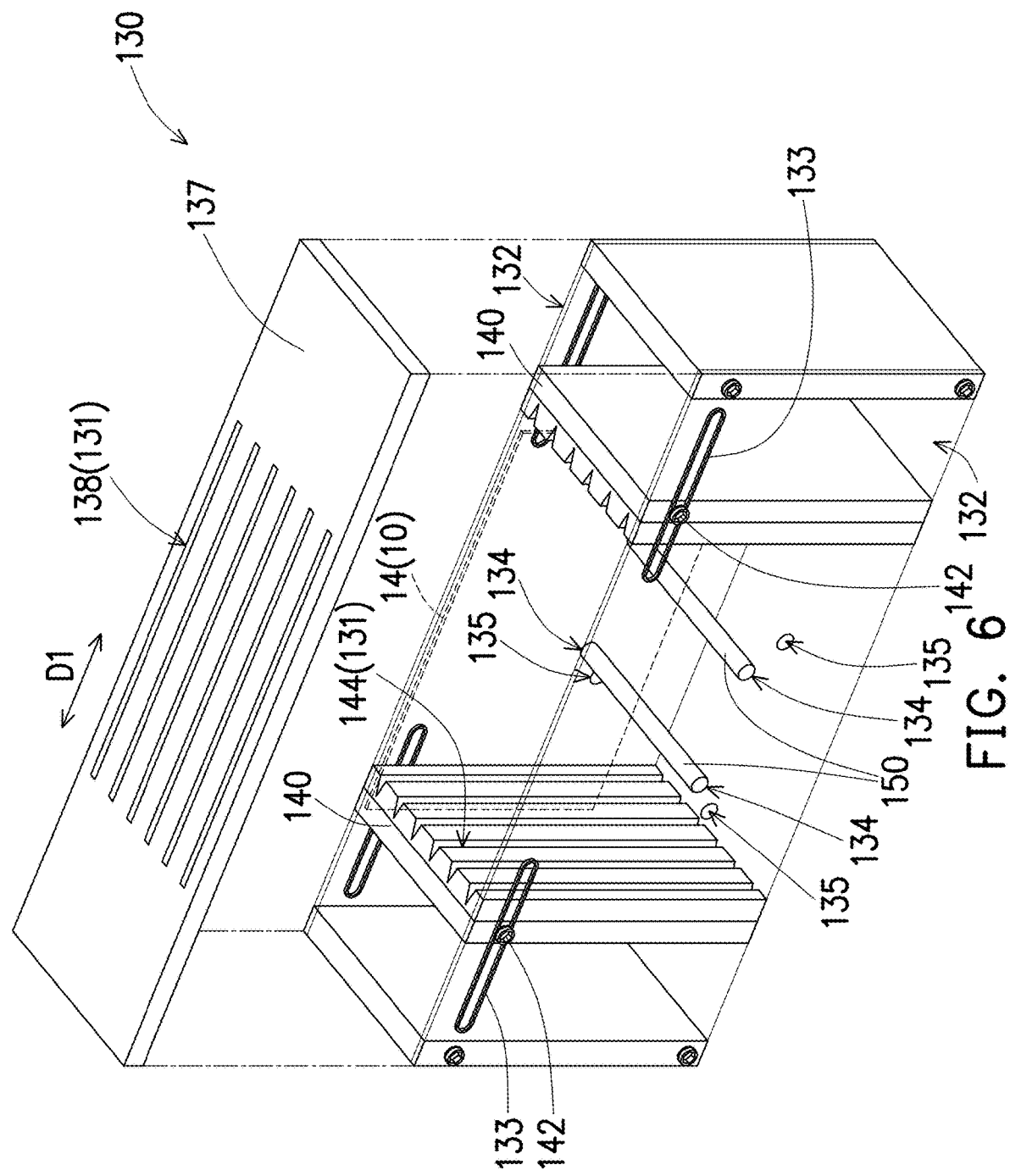
FIG. 6 is a schematic diagram in which a second sidewall of a carrier box of FIG. 5 is moved up and a substrate is disposed in a carrier box.
Figure 7:
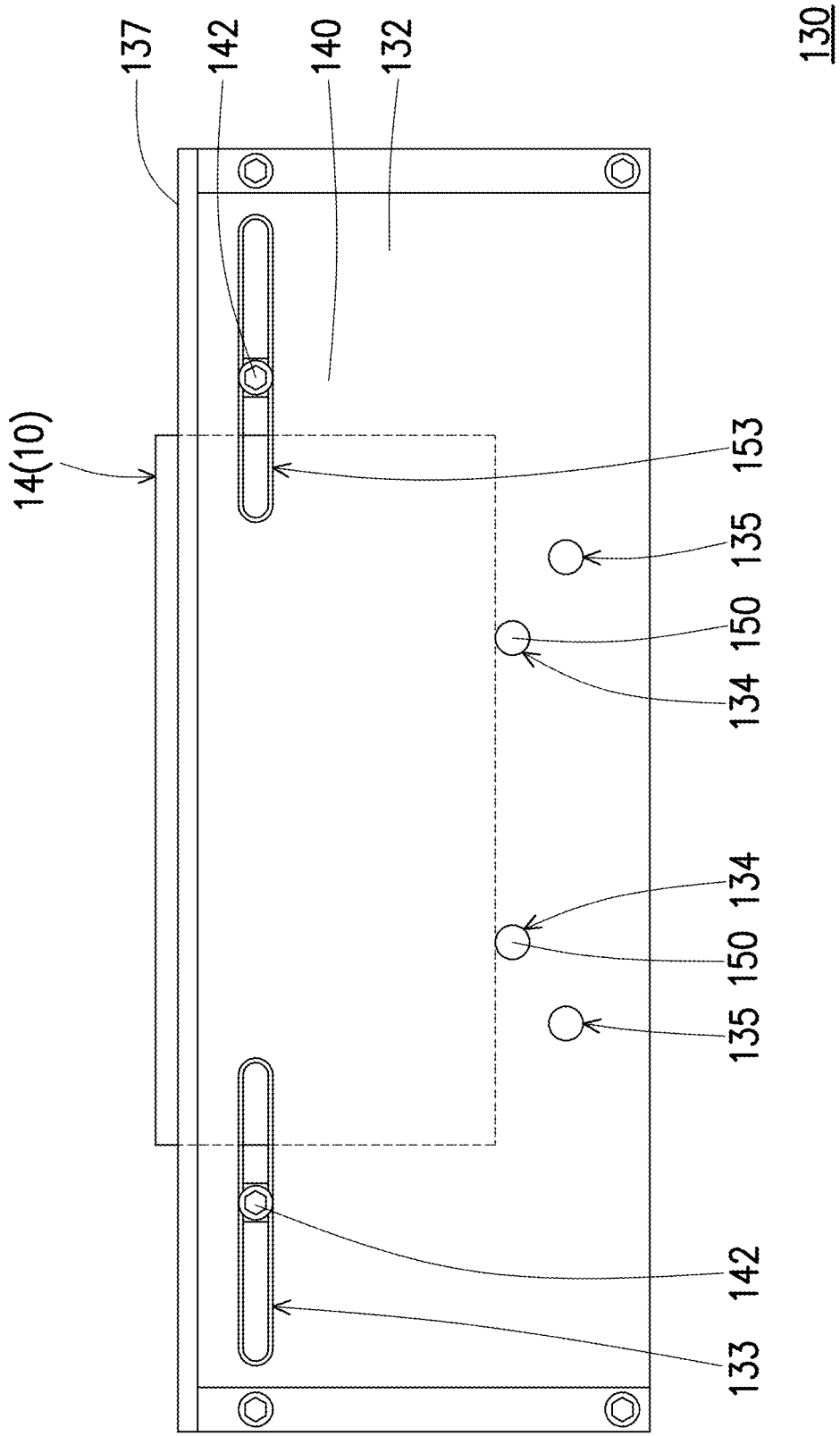
FIG. 7 is a schematic side view in which a substrate disposed the carrier box of FIG. 5.
Figure 8:
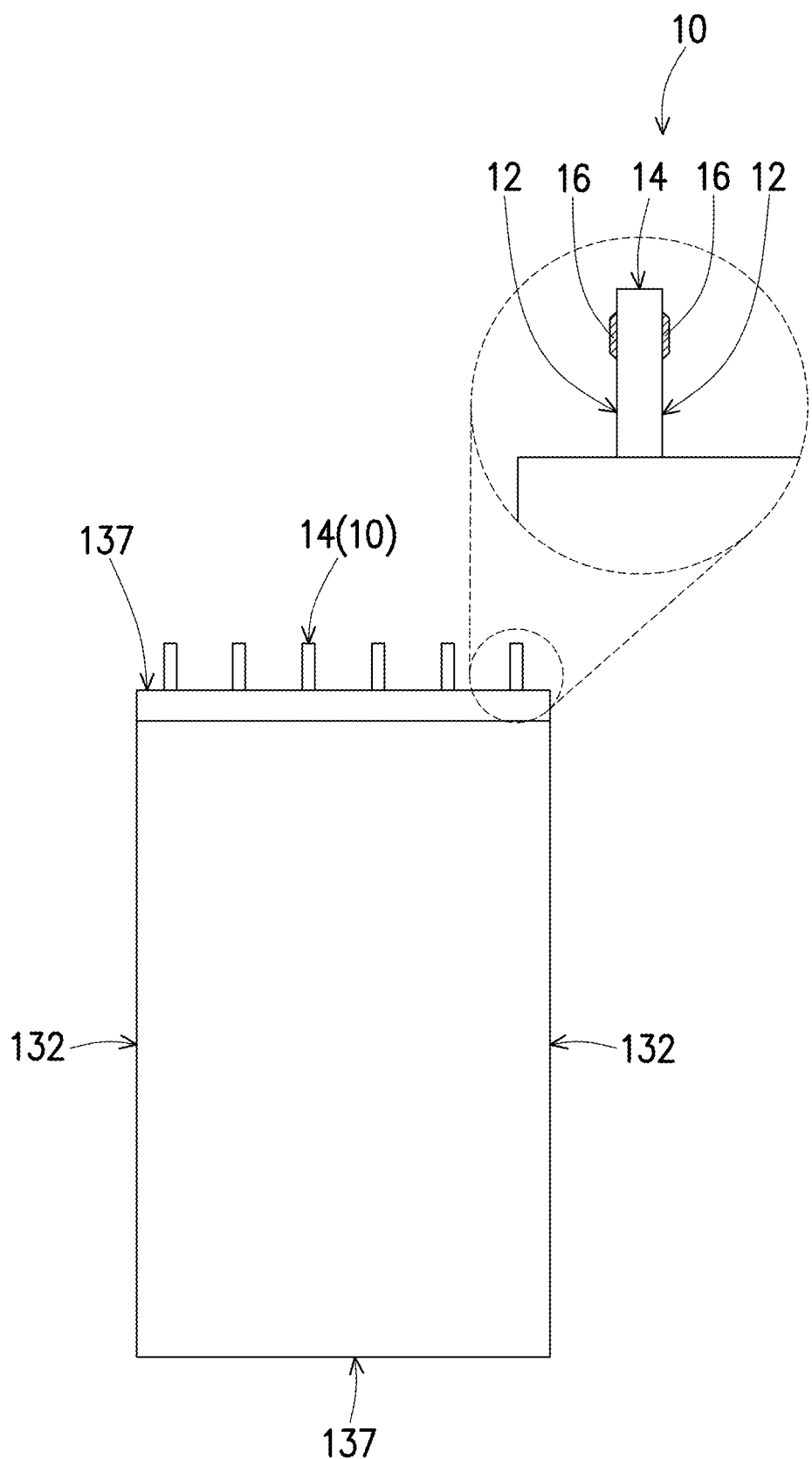
FIG. 8 is another schematic side view of multiple substrates disposed in the carrier box of FIG. 5.

FIG. 5 is a schematic diagram of the carrier box of the sputtering equipment of Figure 2. FIG. 6 is a schematic diagram in which a second sidewall of a carrier box of FIG. 5 is moved up and a substrate is disposed in a carrier box. FIG. 7 is a schematic side view of a substrate disposed in the carrier box of FIG. 5. FIG. 8 is another schematic side view of multiple substrates disposed in the carrier box of FIG. 5. It should be noted that, in FIG. 5 to FIG. 7, only one substrate 10 is drawn with a dashed line as an example, and the number of substrates 10 is not limited thereto.

Referring to FIGS. 5 to 8, in the present embodiment, the carrier box 130 includes two opposite first sidewalls 132 and two opposite second sidewalls 137, and the two second sidewalls 137 are connected to the two first sidewalls 132. In the present embodiment, the two first sidewalls 132 are, for example, a front wall and a rear wall, and the two second sidewalls 137 are, for example, a bottom wall and a top wall, but the disclosure is not limited thereto.

In the present embodiment, the substrate 10 is, for example, a liquid crystal panel, a glass substrate, or other plates, and the type of the substrate 10 is not limited thereto. The substrate 10 includes two opposite main surfaces 12 and the multiple side surfaces 14 connected the two main surfaces 12. An area of the main surface 12 is larger than an area of the side surface 14. When the substrate 10 is disposed in the carrier box 130, the main surfaces 12 of the substrate 10 are located between the two first sidewalls 132 of the carrier box 130.

In the present embodiment, an area of the first sidewall 132 of the carrier box 130 is larger than an area of the second sidewall 137, such that the carrier box 130 has a narrow and tall shape. Of course, in other embodiments, if the carrier box 130 has to carry a large number of substrates 10, the carrier box 130 may also be widened, so as to increase a distance between the two first sidewalls 132. Under such condition, the area of the first sidewall 132 may also be less than or equal to the area of the second sidewall 137.

As shown in FIG. 6, the carrier box 130 includes multiple substrate accommodating grooves 131, and the substrates 10 are adapted for being disposed in the substrate accommodating grooves 131 of the carrier box 130. Specifically, in the present embodiment, the carrier box 130 further includes two positioning seats 140, and the substrate accommodating grooves 131 may be formed between multiple grooves 144 of the two positioning seats 140.

The two positioning seats 140 include multiple protrusions 142 facing the two first sidewalls 132, and the two first sidewalls 132 include multiple grooves 133 extending along an extension direction D1. The protrusions 142 are respectively movably disposed in the grooves 133, such that the two positioning seats 140 are movably disposed between the two first sidewalls 132, so as to adjust a distance between the two positioning seats 140. Therefore, the operator may adjust the distance between the two positioning seats 140 according to a size of the substrate 10, such that the two positioning seats 140 can hold the substrate 10 well.

Moreover, in the present embodiment, the substrate accommodating grooves 131 further include multiple slots 138 on the second sidewall 137, and the slots 138, for example, face upward and face the target set 120 (FIG. 2). The substrate 10 may pass through the slot 138 of the carrier box 130, such that the side surfaces 14 are located outside the carrier box 130 and face the target set 120. In the present embodiment, the extension direction D1 of these substrate accommodating grooves 131 is parallel to the moving direction D2 of the carrier box 130 (FIG. 3).

In other embodiments, the carrier box 130 also may only have the slot 138 on the second sidewall 137 as the substrate accommodating groove 131. Alternatively, the carrier box 130 also may only have the grooves 144 between the two positioning seats 140 as the substrate accommodating grooves 131. The form of the substrate accommodating grooves 131 is not limited to thereto.

Referring to FIG. 6 and FIG. 7, the two first sidewalls 132 of the carrier box 130 include two first perforations 134 corresponding to each other and two second perforations 135 corresponding to each other. A distance between the two first perforations 134 and the second sidewall 137 with the slot 138 (the upper second sidewall 137) is different from (e.g. smaller than) a distance between the two second perforation 135 and the second sidewall 137 with the slot 138 (the upper second sidewall 137).

The sputtering equipment 100 further includes a support column 150. The support column 150 may be optionally inserted between the two first perforation 134 or the two second perforation 135 according to the size of the substrate 10. In the present embodiment, the support column 150 may be configured to support the side surfaces 14 below the substrate 10, such that the substrate 10 may be stably disposed in the carrier box 130.

Moreover, as shown in an enlarged area of FIG. 8, in the present embodiment, two pads 16 are respectively disposed on the two main surfaces 12 of the substrate 10. The two pads 16 are close to the upper side surfaces 14, the upper side surfaces 14 and the two pads 16 are exposed to the carrier box 130, and the side surfaces 14 face the target set 120 (FIG. 2). The target set 120 may sputter the side surfaces 14 of the substrate 10 and the parts of the two main surfaces 12 exposed on the second sidewall 137, such that the two pads 16 are electrically connected to each other.

Figure 9:
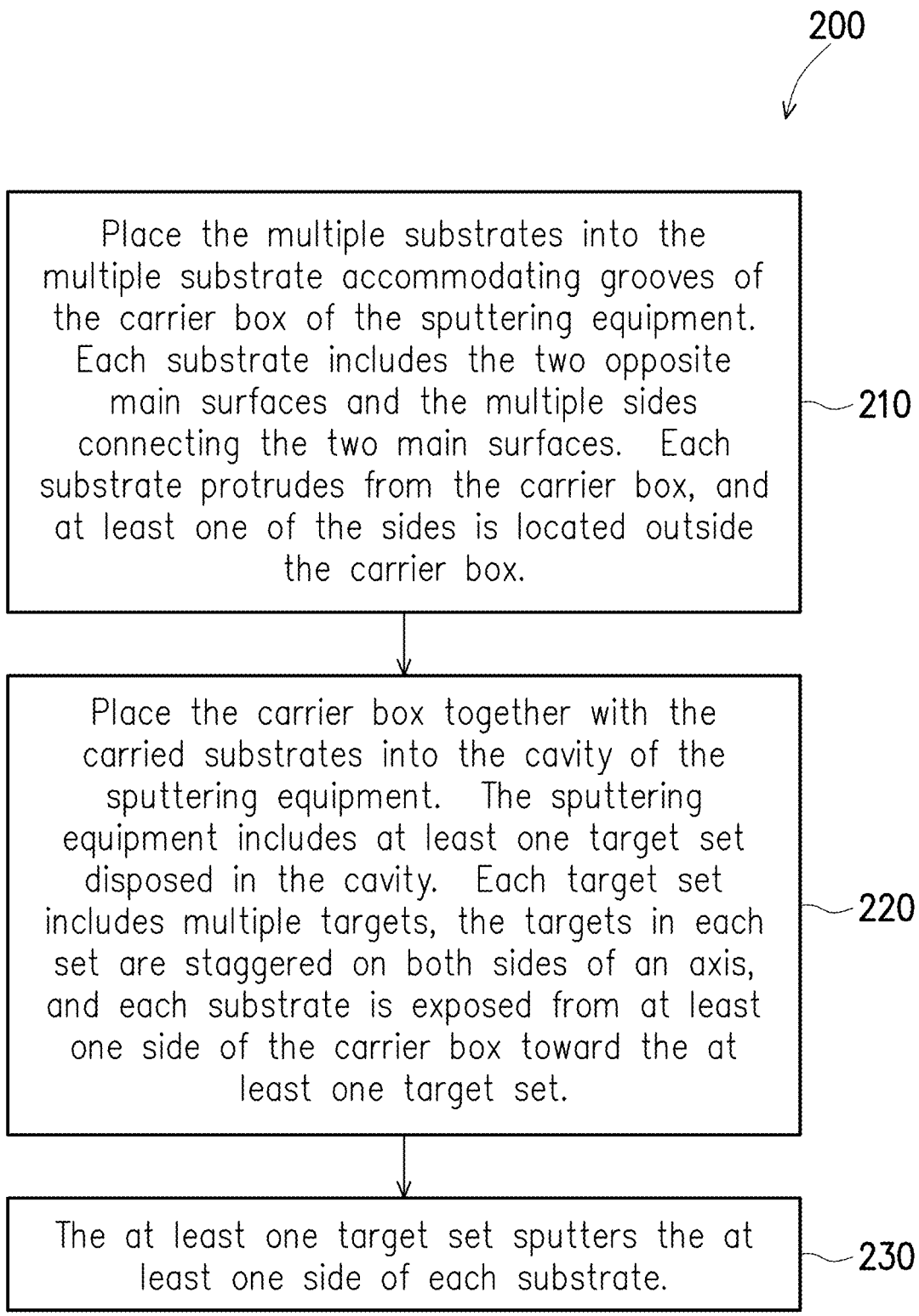
FIG. 9 is a schematic diagram of an operation method of sputtering equipment according to an embodiment of the disclosure.

The following describes an operation method that may be applied to the sputtering equipment 100 shown in FIG. 2. FIG. 9 is a schematic diagram of a sputtering operation method according to an embodiment of the disclosure. Referring to FIG. 9, the operation method of a sputtering equipment of the present embodiment 200 includes the following steps.

Please refer to both FIG. 6 and FIG. 9. First, in step 210, place the multiple substrates 10 into the multiple substrate accommodating grooves 131 of the carrier box 130 of the sputtering equipment 100. Each substrate 10 includes the two opposite main surfaces 12 and the multiple side surfaces 14 connecting the two main surfaces 12. Each substrate 10 protrudes from the carrier box 130, and at least one of the side surfaces 14 is located outside the carrier box 130.

It should be reminded that before step 210, the operator may optionally adjust the distance between the two positioning seats 140 of the sputtering equipment 100 to a length corresponding to the substrates 10, or/and detachably insert the support column 150 through the two first perforation 134 or the two second perforation 135 according to the width of at least one substrate 10.

Please refer to both FIG. 2 and FIG. 9. Then, proceed to step 220, and place the carrier box 130 together with the carried substrates 10 into the cavity 110 of the sputtering equipment 100. The sputtering equipment 100 includes at least one target set 120 disposed in the cavity 110. Each target set 120 includes multiple targets, the targets in each target set are staggered on both sides of the axis A (FIG. 3), and each substrate 10 is exposed from at least one side surface 14 of the carrier box 130 toward the at least one target set 120.

Furthermore, the operator may optionally adjust the angle of the targets 122 or the like, such that the rotation angle of the rotating seat 125 is between 0-40 degrees, preferably between 10-35 degrees.

Finally, in step 230, the at least one target set 120 sputters the at least one side surface 14 of each substrate 10. After step 230, a coating layer 20a (FIG. 10) is formed on the side surfaces 14 and the part of the main surface 12 near the side surfaces 14, and the coating layer 20a covers the pad 16.

Figure 10:
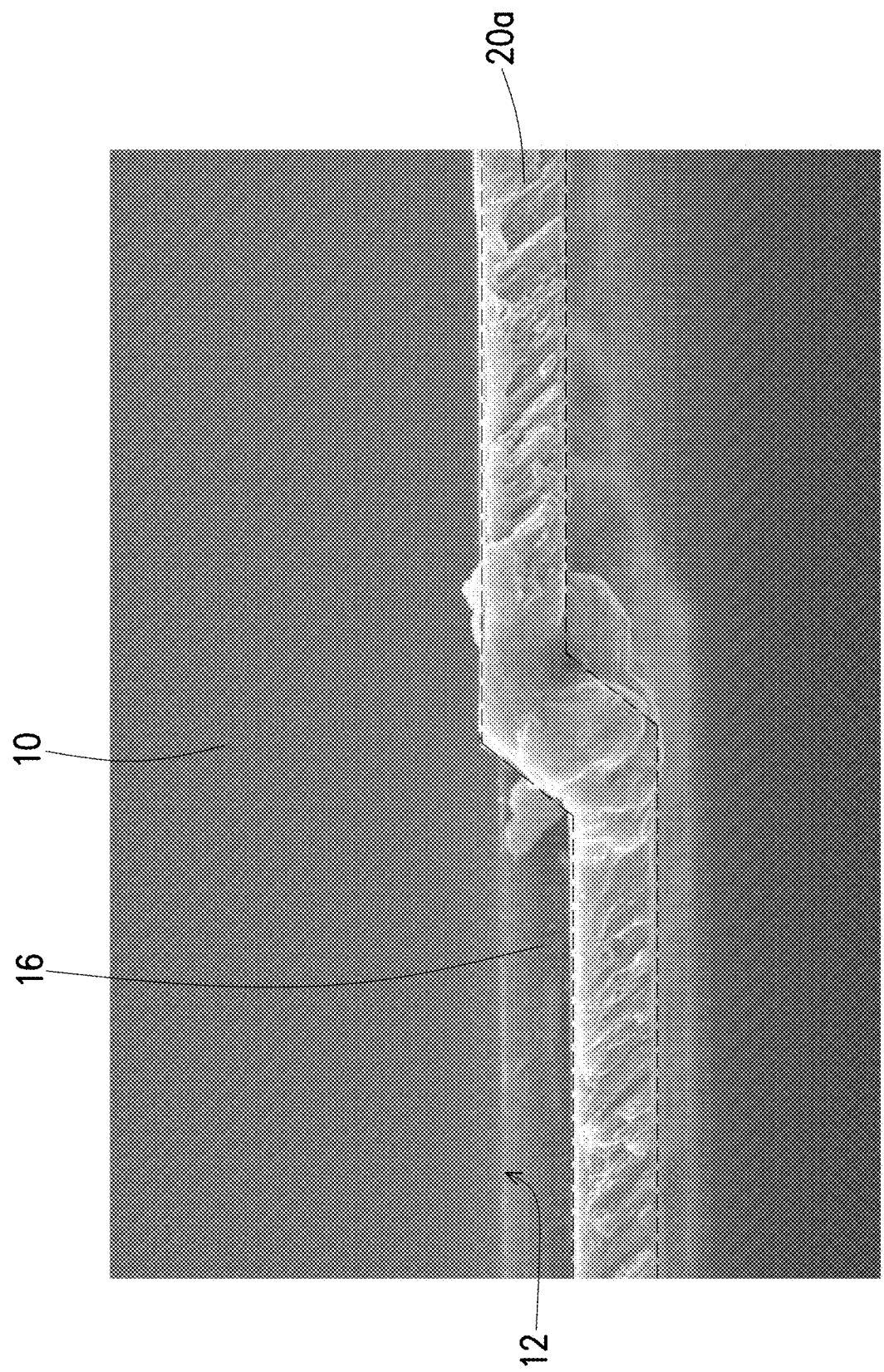
FIG. 10 is an image of a partial area of a coating layer sputtered by a sputtering equipment of the disclosure and a substrate observed under a microscope.

FIG. 10 is an image of a partial area of a coating layer sputtered by a sputtering equipment of the disclosure and a substrate observed under a microscope. Referring to FIG. 10, in the present embodiment, since the target 122 (FIG. 2) sputters toward the side surfaces 14 of the substrate 10, the probability of defects in the coating layer 20a beside the pads 16 and near the side surfaces 14 can be effectively reduced. Moreover, the rotatable design of the target 122 also helps to reduce the defects of the coating layer 20a.

Of course, the number and sequence of sputtering in step 230 may be adjusted according to requirements, and one of the sputtering procedures is introduced below.

Figure 11:
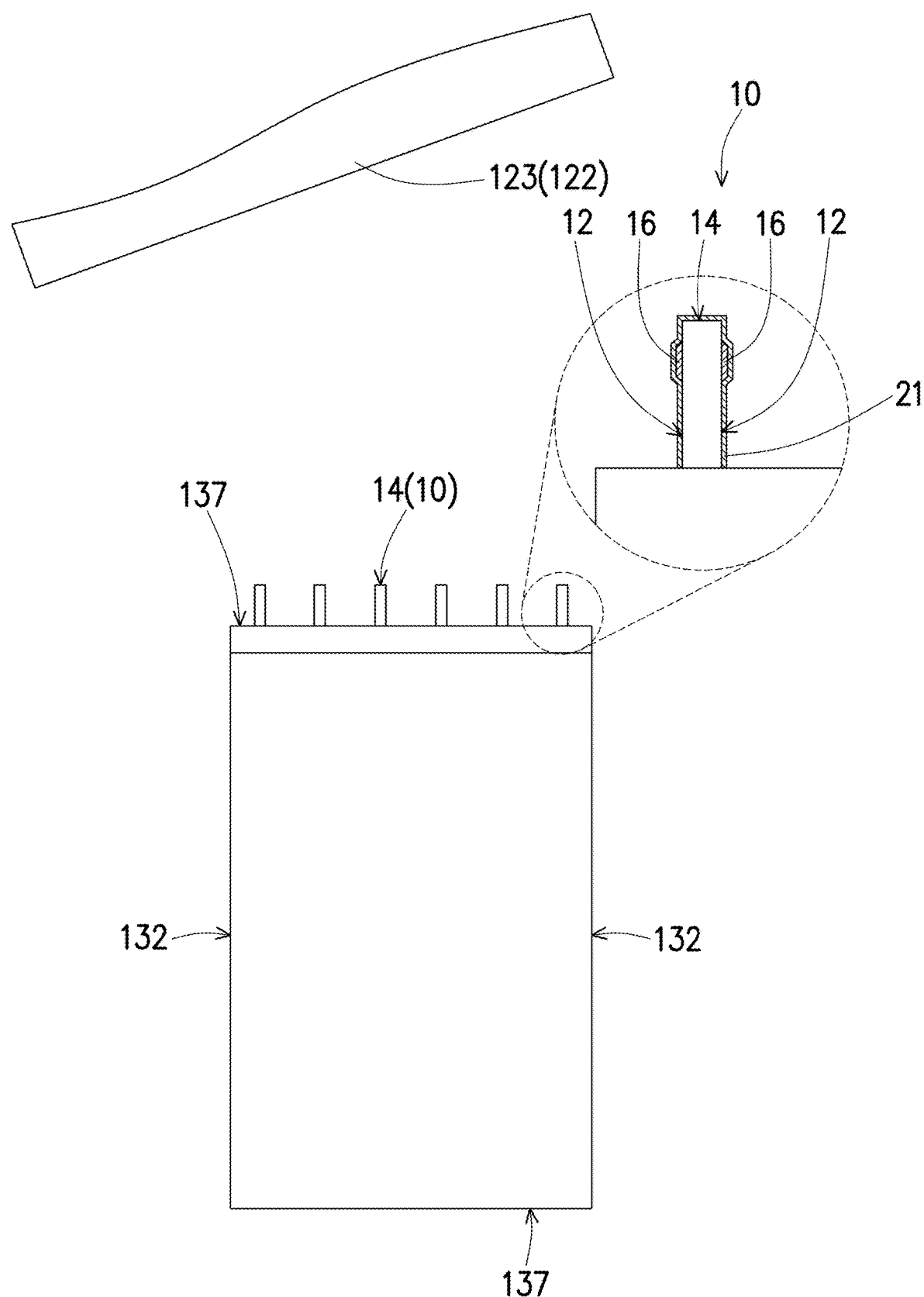
FIG. 11 is a schematic diagram of a substrate after being sputtered by a first target of the sputtering equipment of FIG. 2.

FIG. 11 is a schematic diagram of a substrate after being sputtered by a first target of the sputtering equipment of FIG. 2. Please refer to both FIG. 2 and FIG. 11. First, move the carrier box 130 to a position corresponding to the first target 123 so as to sputter the first target 123 to the side surfaces 14 of each substrate 10, and form a first coating layer 21 on the side surfaces 14 (the enlarged area in FIG. 11).

Specifically, the carrier box 130 may be first moved to be under the first target 123 on the leftmost side of FIG. 2, such that the first target 123 sputters the side surfaces 14 of the substrates 10 and the parts close to the side surfaces 14 on the two main surfaces 12. It is worth mentioning that the first target 123 on the leftmost will be at the upper right of the side surfaces 14 of the substrates 10, so as to better sputter the side surfaces 14 of the substrates 10 and the main surfaces 12 on the right side.

Then, the carrier box 130 may be moved to be under the target 122 (the first target 123) second from the left in FIG. 2. As shown in FIG. 11, the first target 123 will be located at the upper left of the side surfaces 14 of the substrates 10, so as to better sputter the side surfaces 14 of the substrates 10 and the main surfaces 12 on the left side, such that the more uniform first coating layer 21 are formed on the side surfaces 14 and the parts of the two main surfaces 12 near the side surfaces 14. The first coating layer 21 covers the two pads 16.

Figure 12:
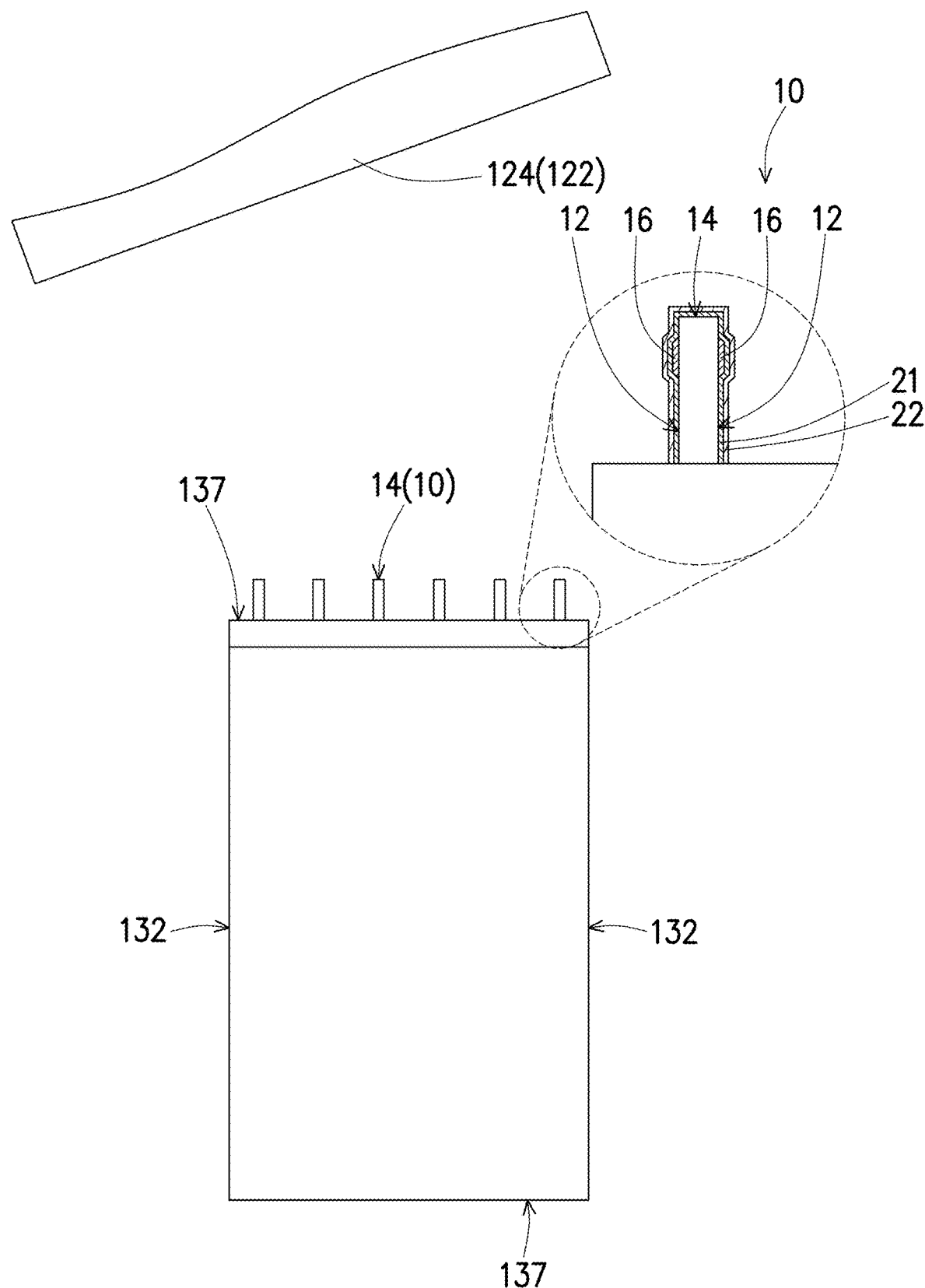
FIG. 12 is a schematic diagram of the substrate of FIG. 11 after being sputtered by a second target of the sputtering equipment of FIG. 2.

FIG. 12 is a schematic diagram of the substrate of FIG. 11 after being sputtered by a second target of the sputtering equipment of FIG. 2. Referring to both FIG. 2 and FIG. 12, the carrier box 130 may be moved to be under the target 122 (the second target 124) third from the left in FIG. 2, so as to sputter the second target 124 onto the first coating layer 21. The second target 124 will be located at the upper right of the side surfaces 14 of the substrates 10, so as to better sputter the side surfaces 14 of the substrates 10 and the main surfaces 12 on the right side.

Then, the carrier box 130 may be moved to the bottom of the rightmost target (the second target 124) in FIG. 2. As shown in FIG. 12, the second target 124 will be located at the upper left side of the side surfaces 14 of the substrates 10 and better sputter the side surfaces 14 of the substrate 10 and the main surfaces 12 on the left side, and a more uniform second coating layer 22 is formed on the first coating layer 21.

Figure 13:
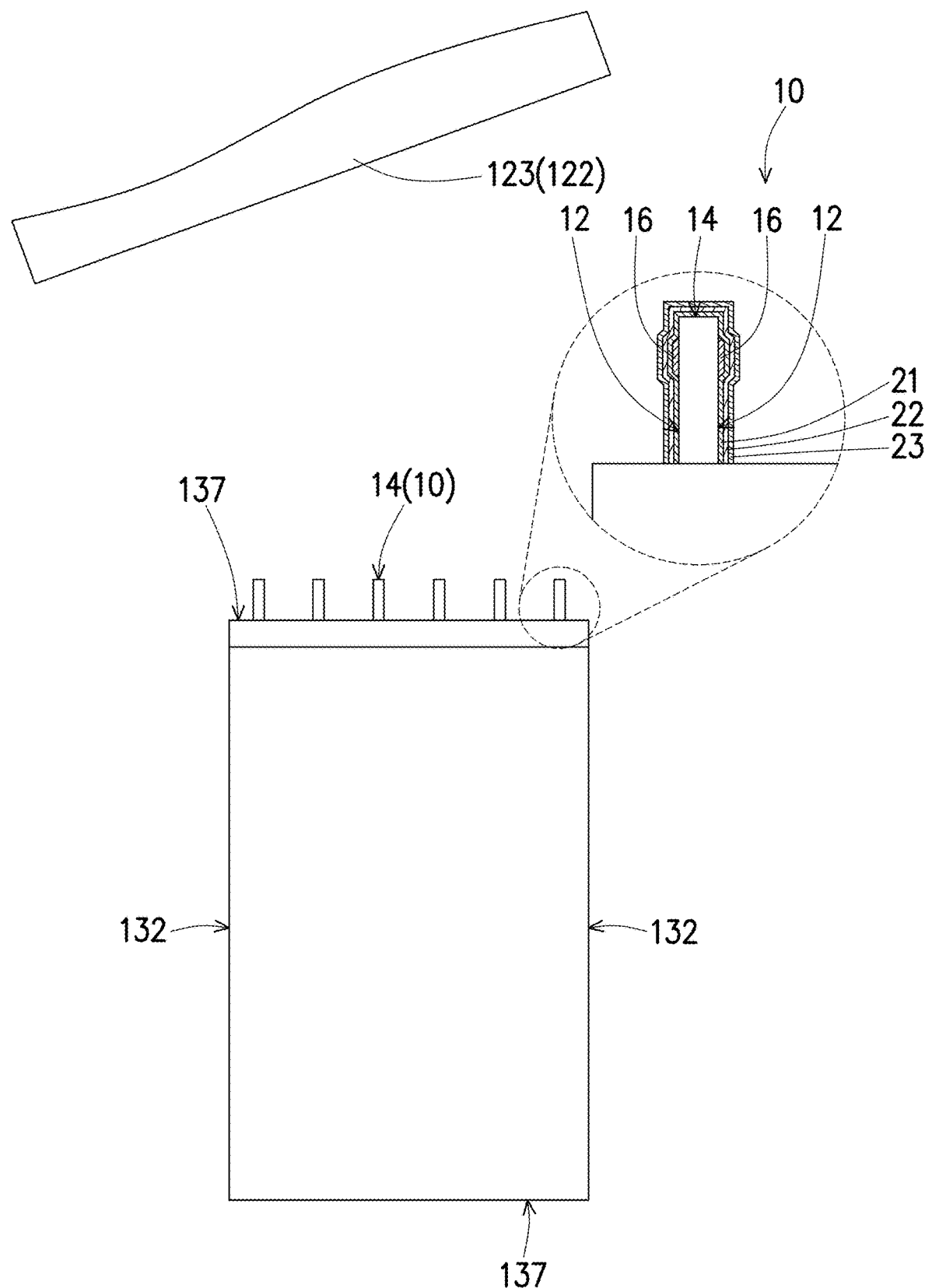
FIG. 13 is a schematic diagram of the substrate of FIG. 12 after being sputtered by a first target of the sputtering equipment of FIG. 2.

FIG. 13 is a schematic diagram of the substrate of FIG. 12 after being sputtered by a first target of the sputtering equipment of FIG. 2. Please refer to both FIG. 2 and FIG. 13. The operator may again move the carrier box 130 to be under the leftmost first target 123 of FIG. 2 for sputtering, and then move the carrier box 130 to be under the first target 123 second from the left of FIG. 2 to sputter the first target 123 onto the second coating layer 22, so as to more uniformly form a third coating layer 23 as shown in FIG. 12.

Of course, the number of sputtering and the number and types of the target 122 are not limited thereto. The operator may adjust according to needs.

Figure 14:
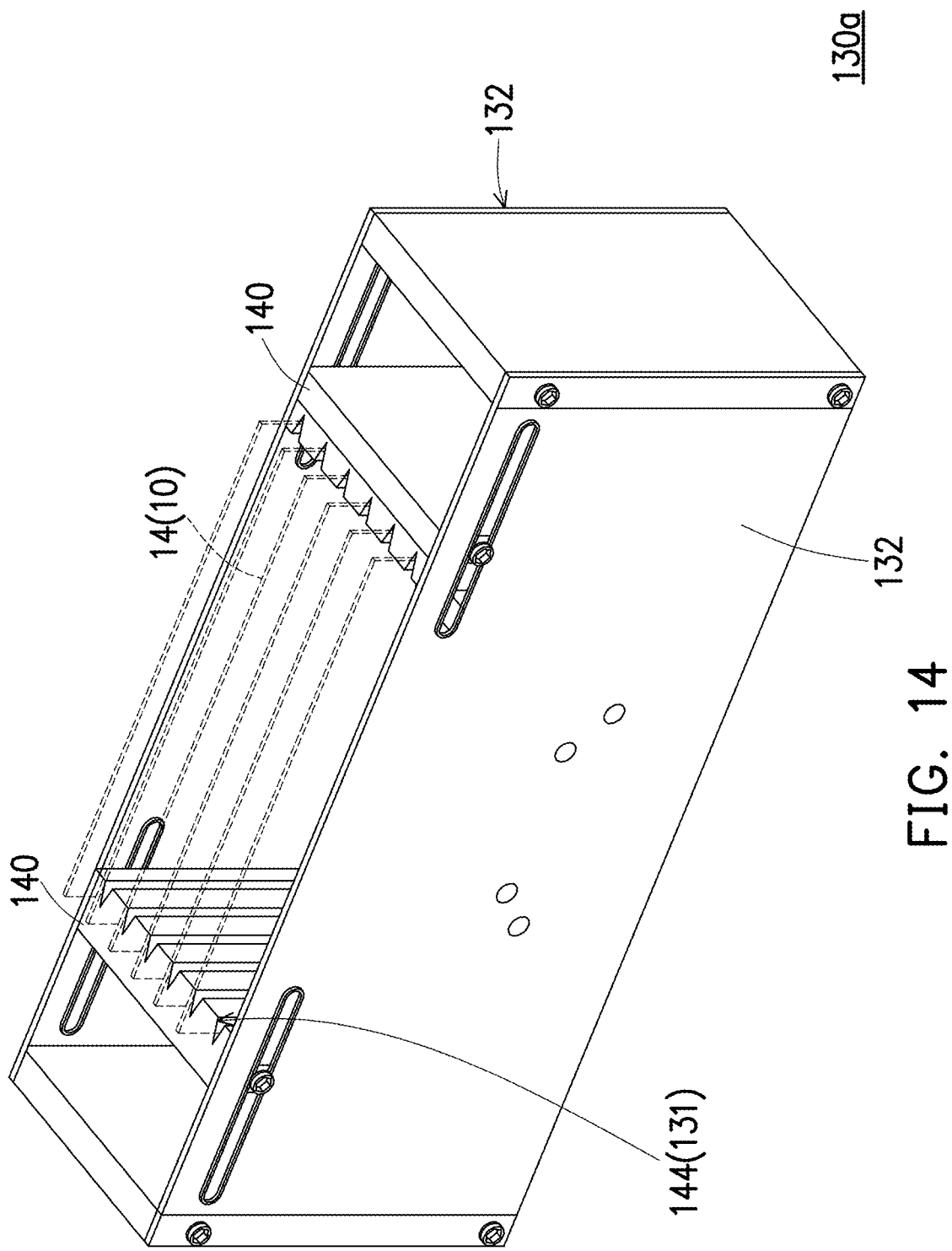
FIG. 14 is a schematic diagram of a carrier box according to another embodiment of the disclosure.

FIG. 14 is a schematic diagram of a carrier box according to another embodiment of the disclosure. Referring to FIG. 14, the main difference between the carrier box 130a of FIG. 14 and the carrier box 130 of FIG. 5 is that, in the present embodiment, the carrier box 130a does not have the second sidewall 137 (FIG. 5) located above the carrier box 130 (FIG. 5). That is to say, in the present embodiment, the substrates 10 are positioned only by the grooves 144 located between the two positioning seats 140.

Similarly, the carrier box 130a of the present embodiment may make the side surfaces 140 of the substrates 10 face the upper target 122 (FIG. 2). In the present embodiment, the operator may apply films on the parts of the two main surfaces 12 of the substrate 10 not to be sputtered, and the target 122 may sputter the side surfaces 140 of the substrates 10 and the parts close to the side surfaces of the two main surfaces 12, and tear apart the films after the sputtering is completed.

Figure 15:
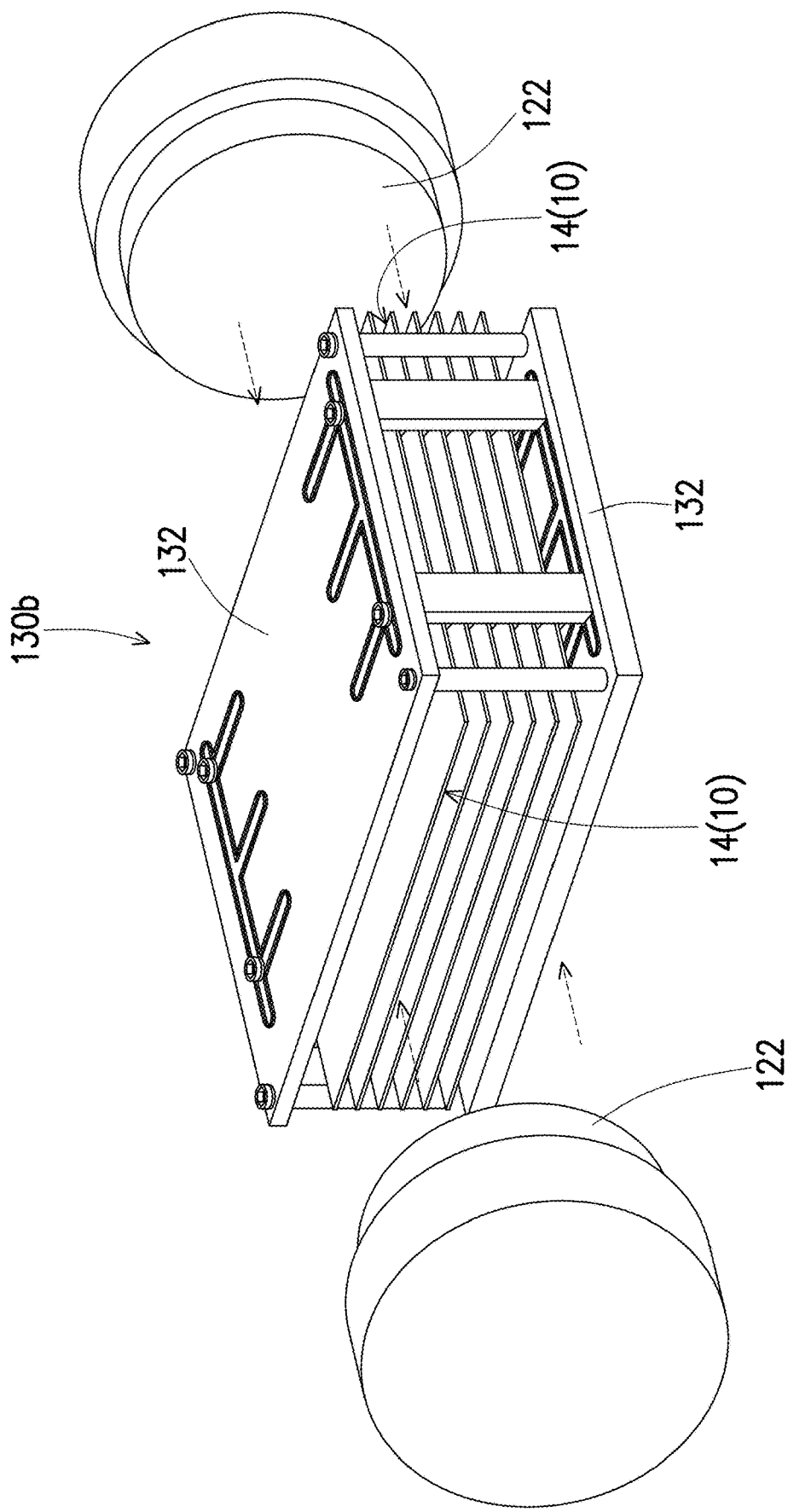
FIG. 15 is a schematic diagram of a carrier box according to another embodiment of the disclosure.

FIG. 15 is a schematic diagram of a carrier box according to another embodiment of the disclosure. Referring to FIG. 15, the main difference between a carrier box 130b in FIG. 15 and the carrier box 130 in FIG. 5 is that, in the present embodiment, the carrier box 130b does not have the two second sidewalls 137 of the carrier box 130 of FIG. 5, and the carrier box 130b is placed horizontally. The left and right side surfaces 14 of each substrate 10 are directly exposed, and the two targets 122 are located on two sides of the carrier box 130b and directly face the left and right side surfaces 14 of each substrate 10. Similarly, in the present embodiment, the operator may apply films on the two main surfaces 12 of the substrates 10 that are not to be sputtered, and tear apart the films after the sputtering is completed.

Of course, in other unillustrated embodiments, it may also be that multiple substrate accommodating grooves (slots) are symmetrically formed on the two second sidewalls of the carrier box, the two target sets are respectively located beside the two second sidewalls, and the substrate accommodating grooves on the two second sidewalls (slots) towards the two target sets. The two target sets may sputter the side surfaces protruding from the substrate accommodating grooves (slots).

In summary, in the conventional sputtering equipment, the target sputters a large area of the main surface of the substrate, and can only sputter one piece at a time. To sputter multiple substrates, the process needs to be repeated multiple times, which is quite time-consuming. Later, the coating layer on the main surface needs to be removed, which causes waste. Furthermore, defects are likely to occur in the coating layer beside the pad and near the side surface using conventional sputtering design of the target facing the main surface. The sputtering equipment and operation method of the disclosure is to sputter the side surface between the two pads in the substrate. The carrier box in the sputtering equipment of the disclosure may allow multiple side surfaces of multiple substrates to protrude from the carrier box and face the target set. Therefore, the target set may sputter the side surfaces of the substrates at the same time, which saves man-hours and materials. Moreover, the design of target sputtering facing the side surfaces may effectively reduce the probability of defects in coating layers. Furthermore, in the sputtering equipment and operation method of the disclosure, the targets of the target set are alternately disposed on both side surfaces of the axis, and may be slightly staggered to sputter the side of the substrate, so as to improve the uniformity of the coating.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A sputtering equipment, adapted for sputtering a plurality of substrates, wherein each of the substrates comprises two opposite main surfaces and a plurality of side surfaces connecting the two main surfaces, the sputtering equipment comprising:

a cavity;

at least one target set, disposed in the cavity, wherein each of the target sets comprises a plurality of targets, and the targets of each of the target sets are staggered at both sides of an axis; and a carrier box, movably disposed so as to enter and exit the cavity and comprising a plurality of substrate accommodating grooves, wherein the substrates are adapted for being disposed in the substrate accommodating grooves of the carrier box, each of the substrates is adapted for protruding from the carrier box such that at least one of the side surfaces is located outside the carrier box, and the at least one of the side surfaces protruding from the carrier box faces the at least one target set.

2. The sputtering equipment as described in claim 1, wherein the carrier box comprises two opposite first sidewalls and two opposite second sidewalls; the two second sidewalls are connected to the two first sidewalls; the substrate accommodating grooves are a plurality slots on at least one of the two second sidewalls; the slots face the at least one target set; and the substrates pass through the slots.

3. The sputtering equipment as described in claim 2, wherein the substrate accommodating grooves are formed on one of the second sidewalls; the substrate accommodating grooves are a plurality of slots; the at least one target set is a single target set; and the slots face the single target set.

4. The sputtering equipment as described in claim 2, wherein the carrier box further comprises two positioning seats, which are movably disposed between the two first sidewalls along an extension direction of the substrate accommodating grooves so as to adjust a distance between the two positioning seats.

5. The sputtering equipment as described in claim 4, wherein the two positioning seats comprise a plurality of protrusions facing the two first sidewalls; the two first sidewalls comprise a plurality of grooves extending along the extension direction; and the protrusions are respectively movably disposed in the grooves.

6. The sputtering equipment as described in claim 2, further comprising a support column, wherein the two first sidewalls of the carrier box comprise two first perforations corresponding to each other, and the support column is detachably inserted through the two first perforations.

7. The sputtering equipment as described in claim 6, wherein the two first sidewalls of the carrier box further comprise two second perforations corresponding to each other; a distance between the two first perforations and the second sidewall having the at least one substrate accommodating groove is different from a distance between the two second perforations and the second sidewall having the at least one substrate accommodating groove; and the support column optionally passes through the two first perforations or the two second perforations.

8. The sputtering equipment as described in claim 1, wherein a moving direction of the carrier box is parallel to an extension direction of the substrate accommodating grooves.

9. The sputtering equipment as described in claim 1, further comprising a plurality of rotating seats, which are rotatably disposed in the cavity, and the plurality of targets are disposed on the rotating seats, and rotation angles of the rotating seats are between 0-40 degrees.

10. The sputtering equipment as described in claim 9, wherein the rotating seats are inclined toward the axis, and rotation angles of the rotating seats are between 10-35 degrees.

11. An operation method of sputtering equipment, comprising:

placing a plurality of substrates into a plurality of substrate accommodating grooves of a carrier box of a sputtering equipment, wherein each of the substrates comprises two opposite main surfaces and a plurality of side surfaces connecting the two main surfaces, and each of the substrates protrudes from the carrier box, such that at least one of the side surfaces is located outside the carrier box;

placing the carrier box together with the carried plurality of the substrates being into a cavity of the sputtering equipment, wherein the sputtering equipment comprises at least one target set disposed in the cavity, each of the at least one target set comprises a plurality of targets, the targets in each of the at least one target set are staggered on both sides of an axis, and the at least one side surface of each of the substrates is exposed from the carrier box faces the at least one target set; and the at least one target set sputters onto the at least one of side surface of each of the substrates.

12. The operation method of sputtering equipment as described in claim 11, wherein two main surfaces of each of the substrates respectively comprises two pads; the two pads are close to one of the side surfaces; the side surface and the two pads are exposed in the carrier box; and the side surface faces the target set, wherein after a step of sputtering onto the side surface of each of the substrates by the target set, a coating layer is formed at a part on the side surface and a part of the two main surfaces near the side surface, and the coating layer covers the two pads.

13. The method for operating sputtering equipment as described in claim 11, wherein the targets of each of the at least one target set comprise at least one first target and at least one second target, and a step of sputtering onto the at least one of the side surfaces of each of the substrates further comprises:

moving the carrier box to a position corresponding to the at least one first target so as to sputter the at least one first target onto the at least one of the side surfaces of each of the substrates so as to form at least one first coating layer on the at least one of the side surfaces; and moving the carrier box to a position corresponding to the at least one second target so as to sputter the at least one second target onto the at least one first coating layer so as to form at least one second coating layer.

14. The operation method of sputtering equipment as described in claim 13, wherein after sputtering the at least one second target to the at least one of the side surfaces of each of the substrates, the method further comprising:

moving the carrier box to a position corresponding to the at least one first target again, so as to sputter the at least one first target onto the at least one second coating layer so as to form at least one third coating layer.

15. The operation method of sputtering equipment as described in claim 11, wherein the carrier box comprises two opposite first sidewalls and two opposite second sidewalls; the two second sidewalls are connected to the two first sidewalls; the substrate accommodating grooves are a plurality of slots on at least one of the two second sidewalls; the slots face the at least one target set; and the substrates pass through the slots.

16. The operation method of sputtering equipment as described in claim 15, wherein the substrate accommodating grooves are formed on one of the second sidewalls; the substrate accommodating grooves are a plurality of slots; the substrates pass through the substrate accommodating grooves of the second sidewall; the at least one target set is a single target set; and the side surfaces of the substrate accommodating grooves passing through the second sidewall face the single target set.

17. The operation method of sputtering equipment as described in claim 15, wherein the sputtering equipment further comprises a support column; the two first sidewalls of the carrier box comprise two first perforations corresponding to each other and two second perforations corresponding to each other; a distance between the two first perforations and the second sidewall having the at least one substrate accommodating groove is different from a distance between the two second perforations and the second sidewall having the at least one substrate accommodating groove; and before a step of placing the substrates into the carrier box of the sputtering equipment, the method further comprises: detachably inserting the support column on the two first perforations or the two second perforations according to a width of the at least one substrate.

18. The operation method of sputtering equipment as described in claim 15, wherein the carrier box further comprises two positioning seats, which are movably disposed between the two first sidewalls along an extension direction of the substrate accommodating grooves so as to adjust a distance between the two positioning seats; and before the step of placing the substrates into the carrier box of the sputtering equipment, the method further comprising: adjusting a distance between the two positioning seats to a length corresponding to the substrates.

19. The operating method of sputtering equipment as described in claim 18, wherein the two positioning seats comprise a plurality of protrusions facing the two first sidewalls, the two first sidewalls comprise a plurality of grooves extending along the extension direction, and the protrusions are respectively movably disposed in the grooves.

20. The operation method of sputtering equipment as described in claim 11, wherein a moving direction of the carrier box is parallel to an extension direction of the substrate accommodating grooves.

21. The operation method of sputtering equipment as described in claim 11, wherein before a step of sputtering onto the at least one of the side surface of each of the substrates, the method further comprising:
adjusting angles of the targets, wherein the sputtering equipment further comprises a plurality of rotating seats, which are rotatably disposed in the cavity; the targets are disposed on the rotating seats; and rotation angles of the rotating seats are between 0-40 degrees.

22. The operation method of sputtering equipment as described in claim 21, wherein the rotating seats are inclined toward the axis, and rotation angles of the rotating seats are between 10-35 degrees.

* * * * *